United States Patent
Chae et al.

(10) Patent No.: US 7,765,459 B2
(45) Date of Patent: Jul. 27, 2010

(54) VITERBI DECODER AND VITERBI DECODING METHOD

(75) Inventors: Su-Chang Chae, Daejeon (KR); Youn-Ok Park, Daejeon (KR)

(73) Assignees: Samsung Electronics Co., Ltd. (KR); Electronics and Telecommunications Research Institute (KR); KT Corporation (KR); SK Telecom Co., Ltd. (KR); Hanaro Telecom, Inc. (KR)

( * ) Notice: Subject to any disclaimer, the term of this patent is extended or adjusted under 35 U.S.C. 154(b) by 939 days.

(21) Appl. No.: 11/529,412

(22) Filed: Sep. 28, 2006

(65) Prior Publication Data

US 2007/0089043 A1    Apr. 19, 2007

(30) Foreign Application Priority Data

Sep. 28, 2005   (KR) .................. 10-2005-0090358
Oct. 17, 2005   (KR) .................. 10-2005-0097676

(51) Int. Cl.
*H03M 13/03*   (2006.01)
(52) U.S. Cl. ..................... 714/795; 375/341
(58) Field of Classification Search ................ 714/792, 714/795, 796; 375/265, 341
See application file for complete search history.

(56) References Cited

U.S. PATENT DOCUMENTS 5,920,597 A * 7/1999 Khayrallah et al. ......... 375/265
7,120,207 B2 * 10/2006 Nordman ..................... 375/341
7,426,249 B2 * 9/2008 Keaney et al. ............... 375/341

OTHER PUBLICATIONS

Ranpara et al. A low power Viterbi decoder design for wireless communications applications. Sep. 1999, Int. ASIC conference. pp. 1-V.*
To Bite or Not to Bite—A Study of Tail Bits Versus Tail-Biting, Yi-Pin Eric Wang, R. Ramesh, 1996 IEEE pp. 317-318.
Modified Register-Exchange Viterbi Decoder for Low-Power Wireless Communications, Dalia A. El-Dib, Mohammed I. Elmasry, IEEE Transactions on Circuits and Systems, vol. 51 No. 2, Feb. 2004, pp. 371-378.

* cited by examiner

*Primary Examiner*—Sam Rizk
(74) *Attorney, Agent, or Firm*—The Farrell Law Firm, LLP

(57) ABSTRACT

The present invention relates to a Viterbi decoder and a Viterbi decoding method in a register exchange method. The Viterbi decoder receives an encoded bit sequence of a convolutional encoding method from a channel, generates an expanded encoded bit sequence by cyclically adding a part of the encoded bit sequence or the entire encoded bit sequence to the encoded bit sequence more than one time, performs a Viterbi decoding operation in a register exchange method, and generates decoded data. In addition, the Viterbi decoder selects an end bit sequence corresponding to the number of the unit of encoded bits among the decoded data, rearranges an order of the end bit sequence, and generates final decoded data.

15 Claims, 16 Drawing Sheets

VITERBI DECODER AND VITERBI DECODING METHOD

PRIORITY

This application claims priority to and the benefit of Korean Patent Application No. 10-2005-0097676 filed on Oct. 17, 2005, and No. 10-2005-0090358 filed on Sep. 28, 2005, in the Korean Intellectual Property Office, the entire contents of which are incorporated herein by reference.

BACKGROUND OF THE INVENTION

1. Field of the Invention

The present invention relates to a Viterbi decoder and a Viterbi decoding method, and more specifically, to a Viterbi decoder and a Viterbi decoding method in a register exchange method.

2. Description of the Related Art

Various digital communication standards adopt a convolutional encoding method to perform forward error correction (FEC). An information bit sequence encoded in the convolutional encoding method is decoded by a Viterbi decoder in a receiver.

FIG. 1 shows a diagram of a configuration of a convolutional encoder having a constraint length K of 7 according to the IEEE802.16 international standard.

As shown in FIG. 1, the convolutional encoder having the constraint length K of 7 according to the IEEE802.16 international standard includes two XOR operators 11 and 12, and six delay units 21 to 26. The convolutional encoder receives one bit among the information bit sequence for every clock signal through a first delay unit 21, and generates two encoded symbols with the two XOR operators 11 and 12. The convolutional code is classified as a zero-tail convolutional code and a tail-biting convolutional code.

The zero-tail convolutional encoding method will now be described with reference to FIG. 2 to FIG. 4.

FIG. 2 shows a diagram for representing a unit packet of encoded bits of an encoder in the zero-tail convolutional encoding method.

As shown in FIG. 2, the unit packet of encoded bits of the encoder in the zero-tail convolutional encoding method is formed by adding a sequence of (K−1) zero-bits (a zero-tail sequence) to the information bit sequence. Therefore, when L denotes the size of the information bit sequence, the size of unit packet of encoded bits of the encoder in the zero-tail convolutional encoding method is L+K−1. When the constraint length K is 7, the unit packet of encoded bits includes L+6 bits.

FIG. 3 shows a diagram for representing an initial state of the encoder in the zero-tail convolutional encoding method. As shown in FIG. 3, each delay unit has a value of 0 when the encoder in the zero-tail convolutional encoding method is at the initial state. Therefore, a Viterbi decoder in the zero-tail convolutional encoding method may start a decoding operation from the 0 state.

FIG. 4 shows a diagram for representing an end state of the encoder in the zero-tail convolutional encoding method. As shown in FIG. 4, the end state of the encoder in the zero-tail convolutional encoding method is the 0 state in which each delay unit has the value of 0. Since 0 values of the last K−1 bits of the unit packet are inputted to the convolutional encoder, the end state of the encoder in the zero-tail convolutional encoding method becomes the 0 state. Therefore, the Viterbi decoder in the zero-tail convolutional encoding method may start a trace-back operation from the 0 state.

Since the additional zero tail sequence having the values of 0 is used in the zero-tail convolutional encoding method, an error may be easily corrected when the last part of the information bit sequence has the error. In addition, the Viterbi decoder may start the decoding and trace-back operations from the 0 state since both the initial and end states of the convolutional encoder are 0, and therefore a configuration of the Viterbi decoder may be simplified. However, there is a problem in that the data rate is reduced due to the additional zero tail sequence in the zero-tail convolutional encoding method. To solve the problem, the tail-biting convolutional encoding method has been suggested.

The tail-biting convolutional encoding method will now be described with reference to FIG. 5 to FIG. 7.

FIG. 5 shows a diagram for representing a unit packet of encoded bits of an encoder in the tail-biting convolutional encoding method. As shown in FIG. 5, the unit packet of encoded bits of the encoder in the tail-biting convolutional encoding method has no additional data. Therefore, the data rate in the tail-biting convolutional encoding method is better than that in the zero-tail convolutional encoding method.

FIG. 6 shows a diagram for representing an initial state of the encoder in the tail-biting convolutional encoding method. As shown in FIG. 6, the initial state of the encoder in the tail-biting convolutional encoding method is determined by the last 6 bits of the unit packet. Since the last 6 bits of the unit packet of the encoder in the tail-biting convolutional encoding method are not 0, the initial state of the encoder in the tail-biting convolutional encoding method is not 0. The encoder in the tail-biting convolutional encoding method preferentially receives the last 6 bits of the unit packet before performing an encoding operation, so as to establish the initial state of the encoder as the last 6 bits of the decoding unit packet. At this time, the encoder in the tail-biting convolutional encoding method does not generate an encoded output bit. Then, the encoder in the tail-biting convolutional encoding method sequentially receives the information bit sequence, and generates the encoded output bit.

FIG. 7 shows a diagram for representing the end state of the encoder in the tail-biting convolutional encoding method. As shown in FIG. 7, differing from the zero-tail convolutional encoding method, the end state in the tail-biting convolutional encoding method is determined by the last 6 bits of the information bit sequence since the end state includes no additional zero-bit. Therefore, the initial and end states of the encoder in the tail-biting convolutional encoding method are the same.

In addition, the initial and end states of the encoder in the tail-biting convolutional encoding method are not 0 since those are determined by the last 6 bits of the unit packet. Therefore, the Viterbi decoder in the tail-biting convolutional encoding method has a problem in determining the initial state, and therefore the configuration of the Viterbi decoder is problematically complicated.

A method for obtaining a final decoding bit sequence by the Viterbi decoder classified as a trace-back method and a register exchange method.

The Viterbi decoder using the trace-back method performs a forward decoding process and a trace-back process. In the forward decoding process, the Viterbi decoder calculates a branch metric BM from the received input bit sequence (i.e., the branch metric corresponding to each branch on a trellis), calculates a path metric PM from the branch metric (i.e., the path metric corresponding to a path to a next state), and selects a survival path by using the calculated path metric. In the trace-back process, the Viterbi decoder traces back the selected survival path to extract a final decoding bit sequence.

The Viterbi decoding method according to the trace-back method will be described with reference to FIG. 8.

FIG. 8 shows a diagram exemplifying a trellis according to the convolutional encoding method.

As shown in FIG. 8, the Viterbi decoder selects a survival path 31 by using a path metric, and extracts a final decoding bit sequence by tracing back the selected survival path 31. In this case, the path metric is not continuously increased since the path metric is normalized.

The Viterbi decoder in the register exchange method has registers at respective states. The Viterbi decoder in the register exchange method performs branch metric and path metric operations to select a path, and adds new path selection information to a register in a previous state of the selected path so as to update the register corresponding to respective current states. Since the register at each state stores a decoded bit sequence corresponding to a path reaching each state, the Viterbi decoder decodes the unit packet of encoded bits and outputs a bit sequence included in a register at an optimum state as the final decode bit sequence. The optimum state indicates a state having a minimum path metric. The Viterbi decoding method according to the register exchange method will be described with reference to FIG. 9.

FIG. 9 shows a diagram exemplifying a register exchange Viterbi decoding process on the trellis.

As shown in FIG. 9, the Viterbi decoder in the register exchange method includes registers corresponding to respective states. In addition, the Viterbi decoder in the register exchange method adds a piece of decode information to the registers at the respective states as a decode operation proceeds, and the registers at the respective states are exchanged with each other according to the survival path.

In the Viterbi decoding method according to the register exchange method, there is a merit in that a time for performing a decoding operation is reduced compared to the trace-back method since it is not required to perform the trace-back operation. Specifically, when the Viterbi decoder in the zero-tail convolutional encoding method uses the trace-back method, the time for performing the decoding operation may be reduced by half compared to the trace-back method. The Viterbi decoder using the tail-biting convolutional encoding method needs an operation for determining an initial state of the decoding operation since the Viterbi decoder may not be informed of the initial state of the decoding operation, but when the Viterbi decoder uses the register exchange method, the time for performing the decoding operation may be reduced compared to the trace-back method.

However, in the register exchange method, since decoding performance generally depends on a forward decoding operation, a bit error rate (BER) is deteriorated compared to the trace-back method. When a bit error occurs on a former part of the information bit sequence by a channel distortion, decoding reliability is reduced. Specifically, since the Viterbi decoder in the tail-biting convolutional encoding method may not correctly determine the initial state, the decoding reliability is further reduced.

In addition, the Viterbi decoder in the register exchange method includes registers at respective states, respective values of the registers frequently vary according to the selected path, and therefore the power consumption may be increased. Further, since the size of the register is increased according to the length of the unit packet of encoded bits, the power consumption is further increased as the length of the unit packet is increased.

A modified register exchange method has been developed to solve the above problem. In the modified register exchange method, the values stored in the respective registers are not exchanged, but pointers corresponding to state values are exchanged to exchange the registers. Since the Viterbi decoder in the modified register exchange method exchanges relatively fewer bits, the power consumption may be reduced. When the constraint length K is 7, the number of register value transitions is given as Equation 1, as follows:

$$\{64(\text{state})*1(\text{bit})+64(\text{state})*6(\text{bit})\}=448 \text{ times} \quad (1)$$

When the constraint length K is 7, the number of states is 64, and therefore the number of register value transitions is 64. In addition, an address of the pointer is 6 bits, and therefore the number of register value transitions caused by the exchange of the pointers is 64*6.

However, in the published modified register exchange method, a considerable number of unit registers are required when the length of the unit packet is increased, since an increase of the length of the unit packet is not considered. For example, when the constraint length is 7 and the length of the unit packet is 480 bits, a required unit register may be given as 480*64=30,720 bits, which is difficult to realize in an integrated circuit.

Other problems of the modified register exchange method will be described with reference to FIG. 10.

FIG. 10 shows a diagram representing the conventional modified register exchange method.

As shown in FIG. 10, in the Viterbi decoder in the modified register exchange method, a value of a register selected for two paths is copied in another register which is not used. In this case, the register which is not used has a different value from a value that was to be originally copied to the register, and therefore, the number of transitions of the register values may be increased, which increases the power consumption. For example, since the register 21 is selected for two paths, the value of the register 21 is copied and stored in the register 23 that is excluded to select the path and is eliminated. The register 23 has the value which is different from the value which was to be copied in the register 23. Therefore, the number of register transitions of the modified register exchange method is increased as shown in Equation 2, as follows:

$$\{(\text{Info\_len}*D)+64(\text{state})*1(\text{bit})+64(\text{state})*6(\text{bit})\}>>448 \text{ times} \quad (2)$$

As shown in Equation 2, a number obtained by multiplying the length Info_len of the unit packet by a frequency D is required to be added to the number of register transitions of the modified register exchange method. The frequency D is the number of cases that one register is selected for two paths. For example, when the length of the unit packet is 480 bits and D=10, the number of register transitions is increased by 4,800 times, which is a great number compared to 488 times.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a Viterbi decoder in a register exchange method, the Viterbi decoder for simplifying a configuration thereof, reducing the power consumption, and reducing the number of required registers, and a Viterbi decoding method thereof. An exemplary Viterbi decoder according to an embodiment of the present invention includes a receiving buffer unit, a received bit sequence expansion unit, a Viterbi decoding unit, an end bit sequence selector, and a rearranging unit. The receiving buffer unit receives an encoded bit sequence of a convolutional encoding method from a channel. The received bit sequence expansion unit receives an encoded bit sequence corresponding to a unit of encoded bits from the receiving buffer unit, and generates an expanded encoded bit sequence by cyclically adding a part of the encoded bit sequence or the entire encoded bit sequence to the encoded bit sequence more than once. The Viterbi decoding unit receives the expanded encoded bit sequence, performs a Viterbi decoding operation in a register exchange method, and outputs decoded data. The end bit sequence selector selects an end bit sequence corresponding to the number of the unit of encoded bits among the decoded data, and outputs the end bit sequence. The rearranging unit rearranges an order of the end bit sequence to generate final decoded data.

In this case, the Viterbi decoding unit includes a branch metric calculator, a path metric storage unit, an exchange register block, an add compare select (ACS) operator, an optimal state determining unit, and an output register selecting unit. The branch metric calculator calculates branch metrics on respective branches by differences between the expanded encoded bit sequence received from the received bit sequence expansion unit and encoded bits on a trellis of a transmitter convolutional encoder. The path metric storage unit stores a path metric for a path selected on the trellis. The exchange register block includes exchange registers corresponding to the number of states of the transmitter convolutional encoder. The add compare select (ACS) operator adds a previous path metric to a branch metric calculated by the branch metric calculator to calculate path metrics for reaching a current state from the respective branches, stores a result of compared path metrics for reaching the current state from the respective branches in the exchange register corresponding to a current state of the exchange register block, and stores a path metric of a path selected according to the result in the path metric storage unit. The optimal state determining unit extracts an optimal state which is a state corresponding to a minimum path metric, among the path metrics stored in the path metric storage unit. The output register selecting unit outputs a value stored in the exchange register corresponding to the optimal state, from among the exchange registers in the exchange register block, to the end bit sequence selector.

In an exemplary Viterbi decoding method according to an embodiment of the present invention, a) an encoded bit sequence of a convolutional encoding method is received from a channel, b) the encoded bit sequence is received as a unit of encoded bits, and a part of the encoded bit sequence or the entire encoded bit sequence is cyclically added to the encoded bit sequence more than once to generate an expanded encoded bit sequence, c) the expanded encoded bit sequence is received, a Viterbi decoding operation is performed in a register exchange method, and decoded data are outputted, d) an end bit sequence corresponding to the number of the encoded unit is selected from the decoded data, and the selected end bit sequence is outputted, and e) an order of the end bit sequence is rearranged to generate final decoded data. In c), branch metrics on respective branches are calculated by differences between the expanded encoded bit sequence and encoded bits on a trellis of a transmitter convolutional encoder, the branch metric is added to a previous path metric to calculate a path metric for reaching a current state from the respective branches, a result of compared path metrics for reaching the current state from the respective branches is stored in an exchange register, an optimal state corresponding to a minimum path metric is extracted from among the path metrics, and a value stored in the exchange register corresponding to the optimal state is outputted.

BRIEF DESCRIPTION OF THE DRAWINGS

The above and other features and aspects of the present invention will be more clearly understood from the following detailed description taken in conjunction with the accompanying drawings, in which.

DETAILED DESCRIPTION OF THE PREFERRED EMBODIMENTS

Figure 1:
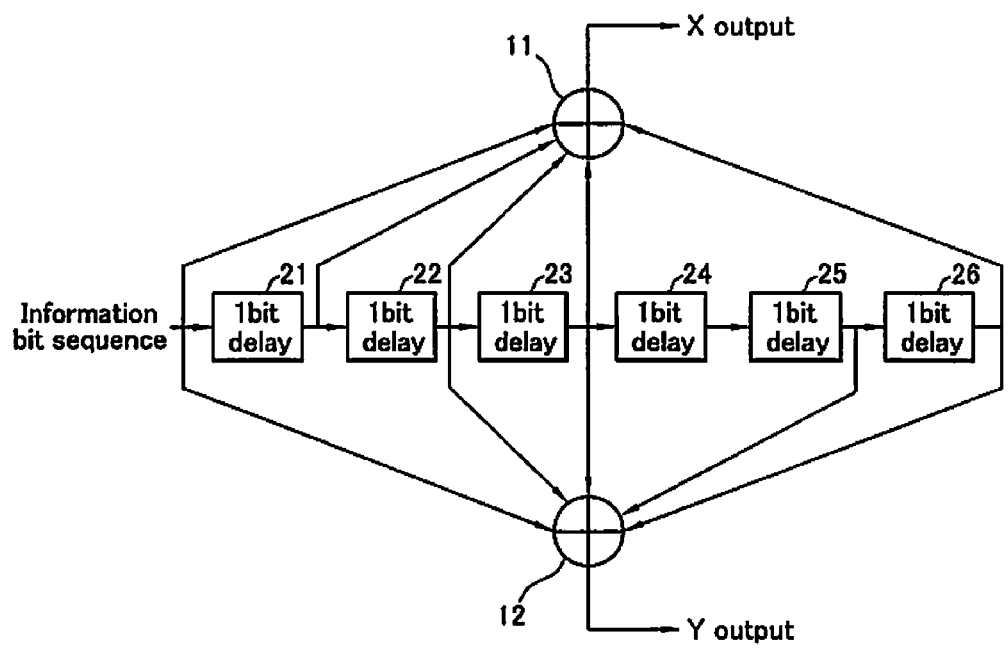
FIG. 1 shows a diagram of a configuration of a convolutional encoder having a constraint length K of 7 according to the IEEE802.16 international standard.
Figure 2:
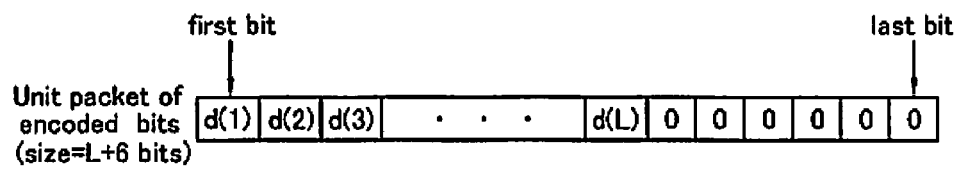
FIG. 2 shows a diagram for representing an unit packet of encoded bits of an encoder in a zero-tail convolutional encoding method.
Figure 3:
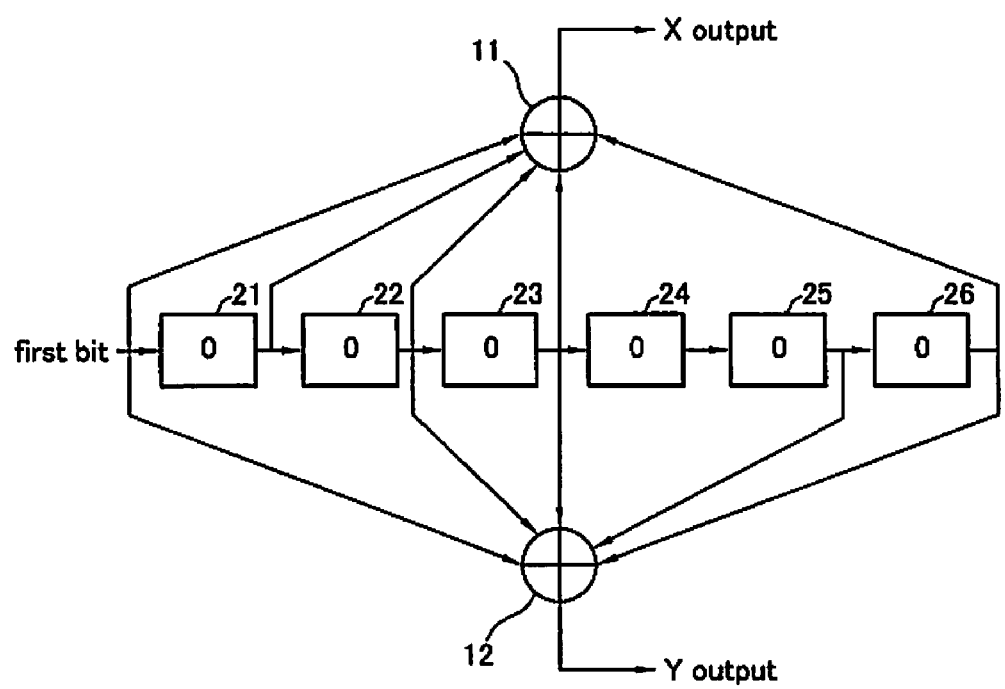
FIG. 3 shows a diagram for representing an initial state of the encoder in the zero-tail convolutional encoding method.
Figure 4:
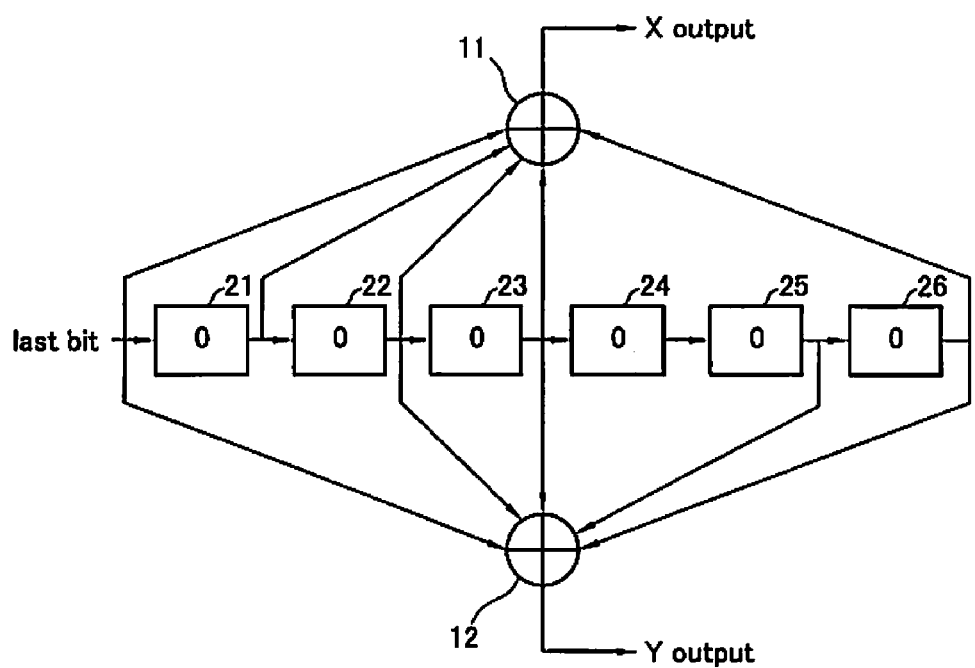
FIG. 4 shows a diagram for representing an end state of the encoder in the zero-tail convolutional encoding method.
Figure 5:
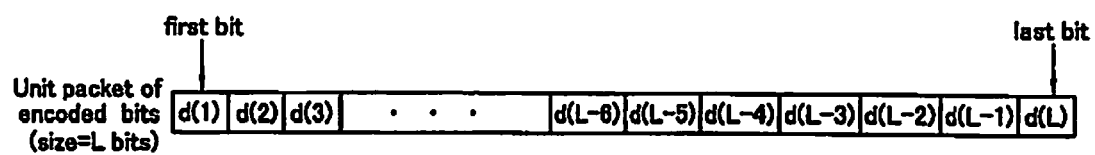
FIG. 5 shows a diagram for representing a unit packet of encoded bits of an encoder in a tail-biting convolutional encoding method.
Figure 6:
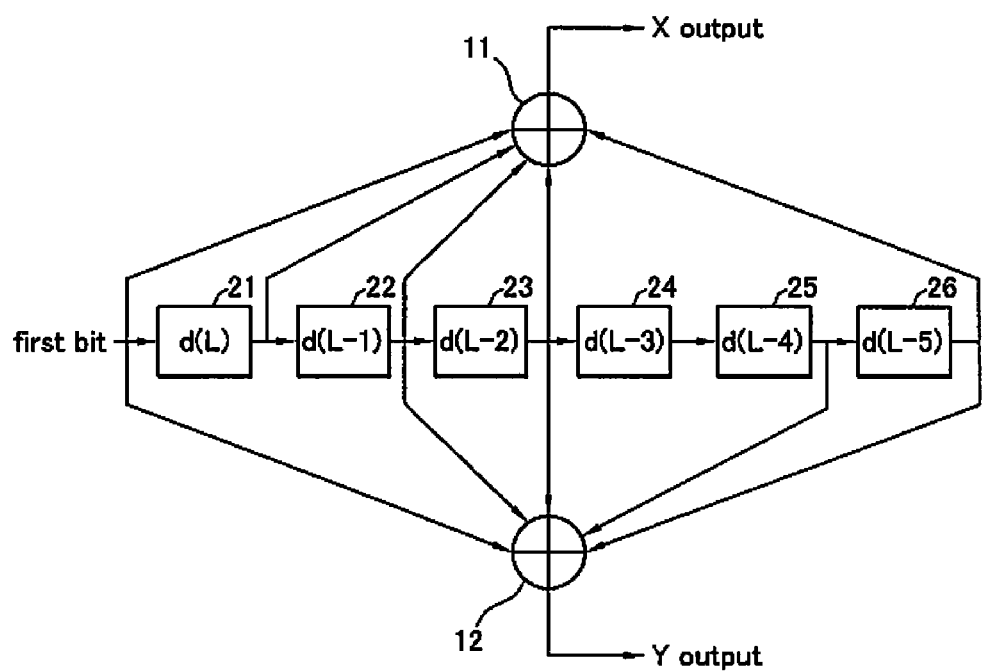
FIG. 6 shows a diagram for representing the initial state of the encoder in the tail-biting convolutional encoding method.
Figure 7:
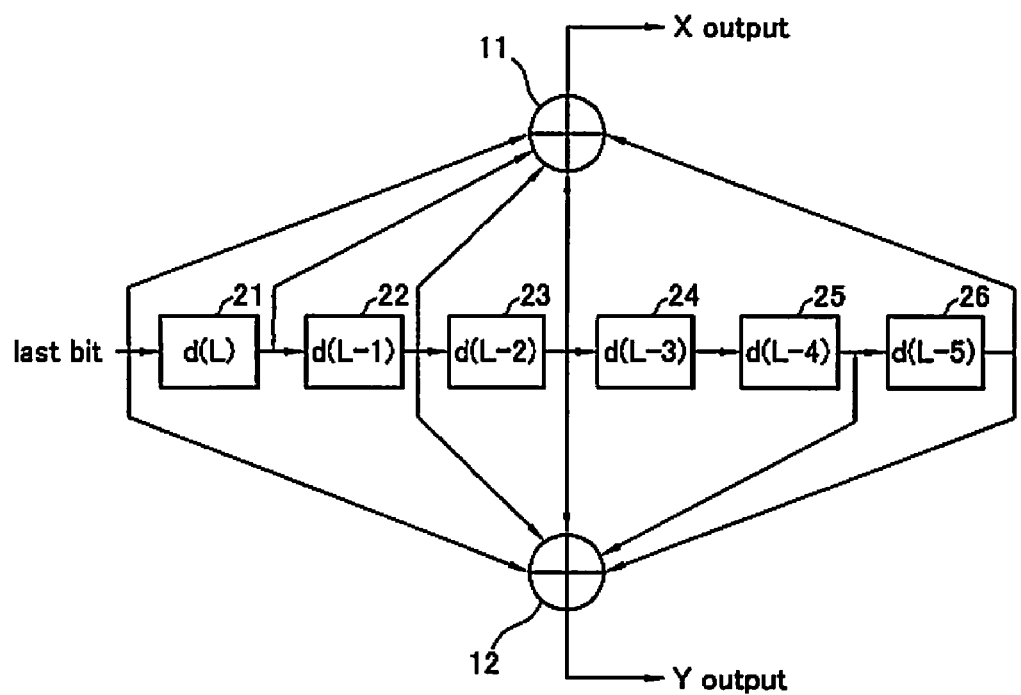
FIG. 7 shows a diagram for representing the end state of the encoder in the tail-biting convolutional encoding method.
Figure 8:
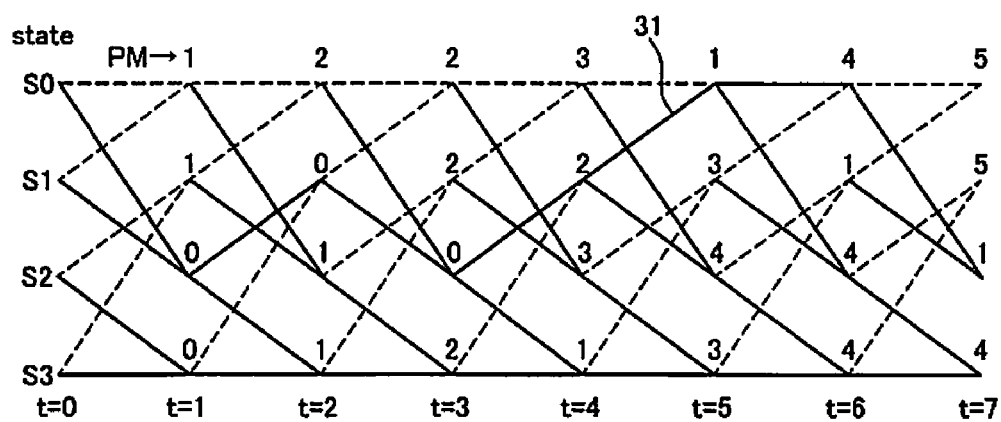
FIG. 8 shows a diagram exemplifying a trellis according to a convolutional encoding method.
Figure 9:
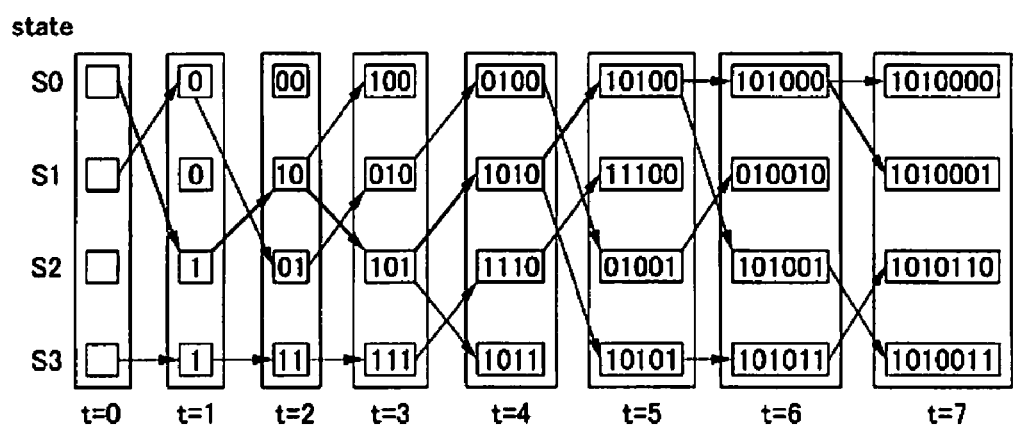
FIG. 9 shows a diagram exemplifying a register exchange Viterbi decoding process on the trellis.
Figure 10:
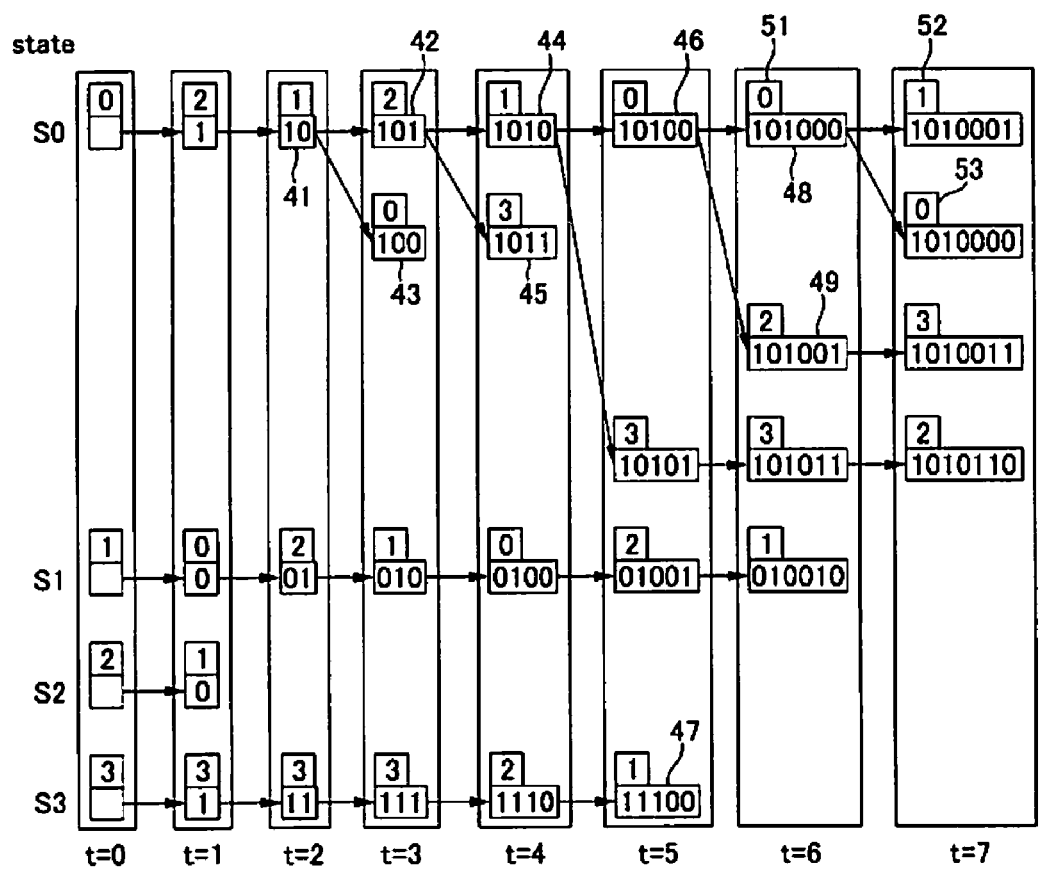
FIG. 10 shows a diagram representing a conventional modified register exchange method.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

When it is described that an element is coupled to another element, the element may be directly coupled to the other element or coupled to the other element through a third element.

While a transmitter uses a convolution encoder having a constraint length K of 7 according to the IEEE802.16 international standard in an exemplary embodiment of the present invention, it is to be understood that the present invention covers various convolutional encoders.

Hereinafter, L denotes the size of a unit of encoded bits of the convolutional encoder. At this time, when a code rate of the convolutional encoder is k/n, an encoded output bit sequence of the convolutional encoder will be L*n/k (hereinafter, L*n/k will also be referred to as M). For example, when the constraint length of the convolutional encoder is 7 according to the IEEE802.16, the encoded output bit sequence of the convolutional encoder will be 2L. Hereinafter, a length of the encoded output bit sequence will be referred to as L*n/k in the exemplary embodiment of the present invention.

A Viterbi decoder according to the exemplary embodiment of the present invention will now be described with reference to FIG. 11 to FIG. 15.

Figure 11:
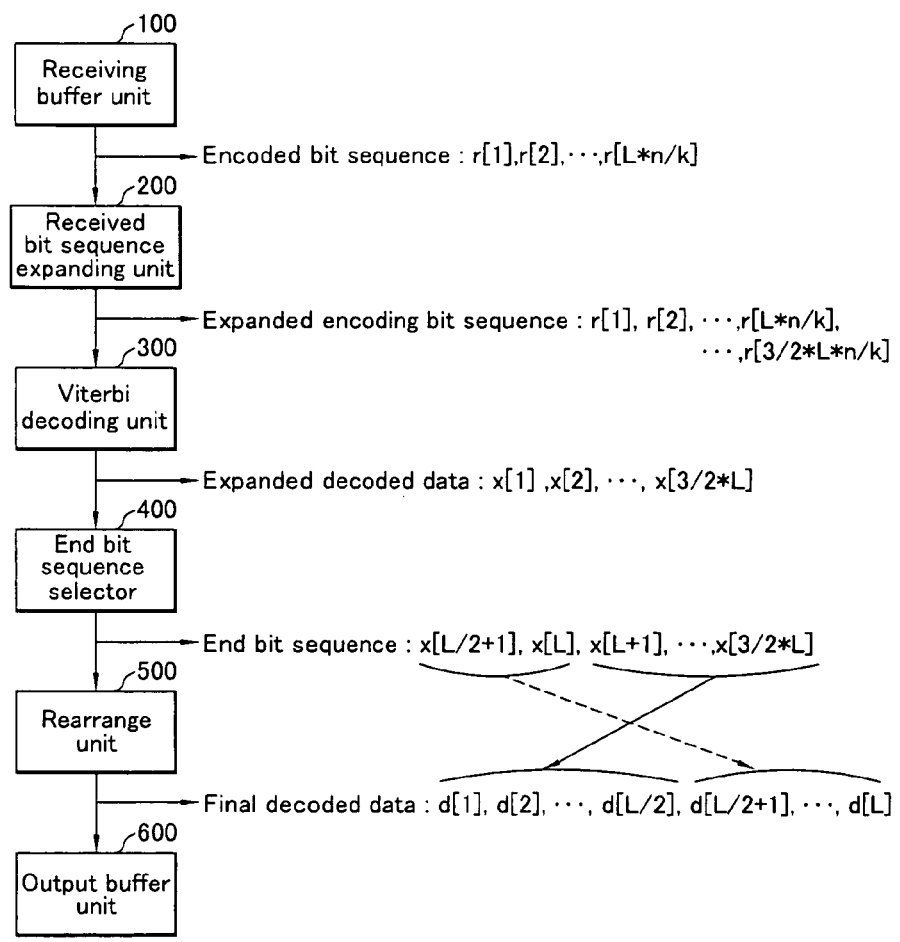
FIG. 11 shows a diagram of a configuration of the Viterbi decoder according to an exemplary embodiment of the present invention.

FIG. 11 shows a diagram of a configuration of the Viterbi decoder according to the exemplary embodiment of the present invention.

As shown in FIG. 11, the Viterbi decoder according to the exemplary embodiment of the present invention includes a receiving buffer unit 100, a received bit sequence expansion unit 200, a Viterbi decoding unit 300, an end bit sequence selector 400, a rearranging unit 500, and an output buffer unit 600.

The receiving buffer unit 100 receives an encoded bit sequence of a convolutional encoding method through a channel. The encoded bit sequence may be an encoded bit sequence of a zero-tail convolutional encoding method, or an encoded bit sequence of a tail-biting convolutional encoding method.

The received bit sequence expansion unit 200 receives a sequence of L*n/k encoded bits corresponding to the unit L of encoded bits of the convolutional encoder from the receiving buffer 100. In addition, the received bit sequence expanding unit 200 generates an expanded encoded bit sequence based on the received encoded bit sequence. The expanded encoded bit sequence is obtained by cyclically adding a part of the encoded bit sequence or the entire encoded bit sequence to the encoded bit sequence received from the receiving buffer unit, more than once. When a bit sequence is cyclically added to a bit sequence (b[0], b[1], . . . , and b[n]), the word "cyclically" will be understood to mean that a b[0] bit is added after a b[n] bit, and then bits are added in a natural number order. As shown in FIG. 11, the received bit sequence expansion unit 200 outputs the expanded encoded bit sequence which is a signal obtained by outputting the encoded bit sequence once and then additionally outputting a former half of the encoded bit sequence. As described above, the received bit sequence expansion unit 200 expands the encoded bit sequence to output the expanded encoded bit sequence in order to find an initial forward decoding state since the initial forward decoding state may not be informed when the encoded bit sequence is encoded in the tail-biting convolutional encoding method. That is, the Viterbi decoder according to the exemplary embodiment of the present invention performs a forward decoding operation of the former part (r[1], r[2], . . . , and r[1/2*L*n/k]) of the expanded encoded bit sequence to obtain the initial forward decoding state. Therefore, in the exemplary embodiment of the present invention, it is not necessary to add the former half of the encoded bit sequence to the encoded bit sequence to obtain the expanded encoded bit sequence, and only enough of the bit sequence needed to obtain the initial forward decoding state may be added. For example, to obtain the expanded encoded bit sequence, the encoded bit sequence may be repeatedly added twice or three times, or the encoded bit sequence may be repeatedly added twice and a third of the encoded bit sequence may be added.

The Viterbi decoding unit 300 decodes the expanded encoded bit sequence in a Viterbi decoding method. The Viterbi decoding unit 300 receives 3/2*L*n/k encoded bit sequences, and outputs 3/2*L expanded decoded data. The Viterbi decoding unit 300 uses various Viterbi decoding methods including a Radix-2 method and a Radix-4 method.

The end bit sequence selector 400 selects a last L end bit sequence (x[L/2+1], . . . , x[L], x[L+1], . . . , x[3/2*L]) among the 3/2*L expanded decoded data generated by the Viterbi decoding unit 300, and outputs the selected L end bit sequence (x[L/2+1], . . . , x[L], x[L+1], . . . , x[3/2*L]). The former part of the bit sequence has errors since it is for obtaining the normal initial forward decoding state. Accordingly, the end bit sequence selector 400 discards the former part of the expanded decoded data.

The rearranging unit 500 rearranges the end bit sequence selected by the end bit sequence selector 400 to output a final decoded data. That is, the rearranging unit 500 outputs a latter half (x[L+1], . . . , d[3/2*L]) of the end bit sequence first, and then outputs the former half (x[L/2+1], . . . , x[L]) of the end bit sequence. The latter half (x[L+1], . . . , d[3/2*L]) of the end bit sequence is the former half (d[1], . . . , d[L/2]) of the final decoded data. The rearranging unit 500 is differently realized according to the above various expanded encoded bit sequences, which is well known to those skilled in the art, and therefore a detailed description thereof will be omitted.

The output buffer unit 600 stores the final decoded data in a buffer and outputs the final decoded data as 8 bits or 16 bits as necessary.

Figure 12:
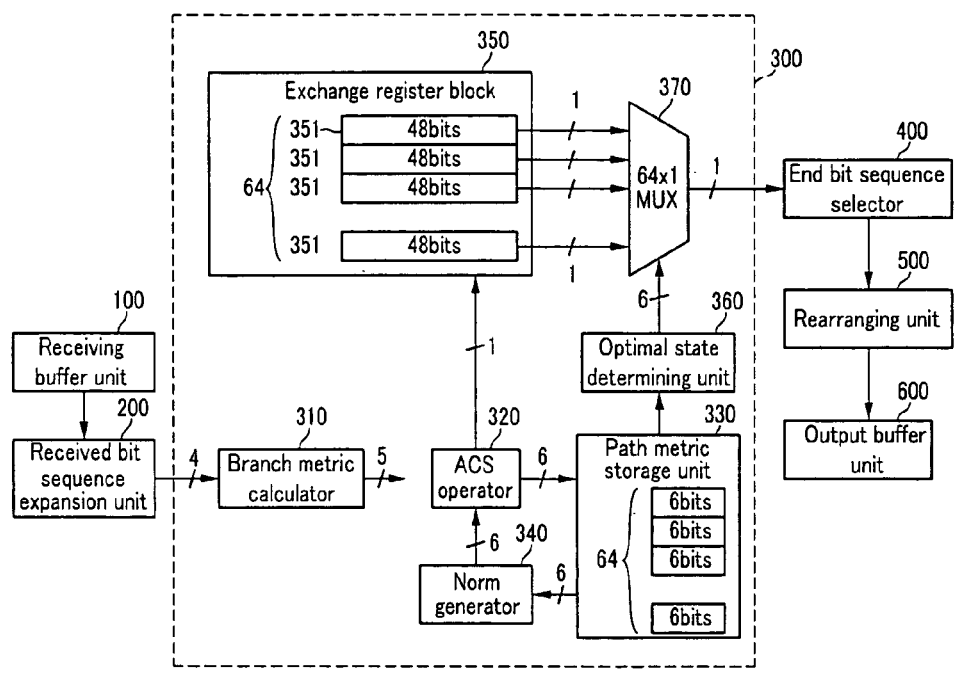
FIG. 12 shows a diagram of a configuration of the Viterbi decoding unit 300 in the Viterbi decoder according to the exemplary embodiment of the present invention.

FIG. 12 shows a diagram of a configuration of the Viterbi decoding unit 300 in the Viterbi decoder according to the exemplary embodiment of the present invention.

As shown in FIG. 12, the Viterbi decoding unit 300 includes a branch metric calculator 310, an add compare select (ACS) operator 320, a path metric storage unit 330, a norm generator 340, an exchange register block 350, an optimal state determining unit 360, and an output register selecting unit 370.

The branch metric calculator 310 calculates branch metrics on respective branches by differences between the expanded encoded bit sequence received from the received bit sequence expansion unit 200 and encoded bits on a trellis of a transmitter convolutional encoder (the encoded bits on the trellis are also referred to as branch coded word (BCW)).

The ACS operator 320 adds a previous path metric to the branch metric calculated by the branch metric calculator 310 to calculate metrics of paths from the respective branches to a current state, and stores the calculated path metric in the path metric storage unit 330. In addition, the ACS operator 320 compares the metrics of paths from the respective branches to the current state, and stores the result of the compared metrics in the exchange register block 350. The previous path metric may be a normalized path metric, which will be described later in the specification.

The path metric storage unit 330 stores the path metric calculated by the ACS operator 320.

The norm generator 340 generates a normalizing factor to prevent the path metric from being unlimitedly increased. The normalizing factor according to the exemplary embodiment of the present invention indicates a minimum value among the path metrics stored in the path metric storage unit 330. That is, a plurality of path metrics are continuously reduced to a minimum value thereof, so that the path metrics are not unlimitedly increased.

The exchange register block 350 includes exchange registers 351 corresponding to a state of the Viterbi decoding unit 300. An exchange register 351 corresponds to a predetermined state of the Viterbi decoding unit 300, is realized to store 1 bit, and is realized as a first in first out (FIFO) shift register in the exemplary embodiment of the present invention. The respective exchange registers 351 according to the exemplary embodiment of the present invention include 48 bits regardless of the size of a unit of encoded bits (i.e., the exchange register 351 includes 48 unit registers), and the Viterbi decoding unit 300 outputs the decoded 48 bits when the 48 bits are decoded. The Viterbi decoding unit 300 divides the encoded bit sequence as 48 bits to process the encoded bit sequence regardless of the size of the unit of encoded bits, so that the number of exchanged bits and the power consumption are reduced, and it is not required to provide the registers corresponding to L which is the size of the unit of encoded bits. The unit of 48 bits may vary according to various embodiments of the present invention.

The optimal state determining unit 360 outputs a state corresponding to the minimum path metric among the path metrics stored in the path metric storage unit 330.

The output register selecting unit 370 selects a register corresponding to the state determined by the optimal state determining unit 360 and outputs a value stored in the register to the end bit sequence selector 400.

Figure 13:
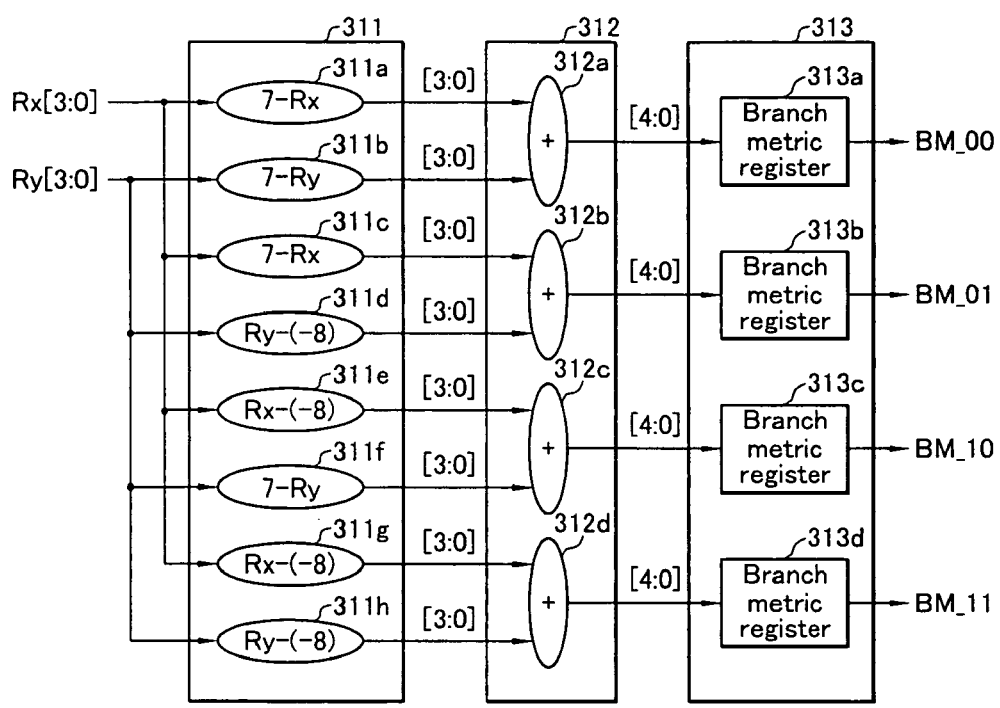
FIG. 13 shows a diagram of a configuration of the branch metric calculator 310 according to the exemplary embodiment of the present invention.

FIG. 13 shows a diagram of a configuration of the branch metric calculator 310 according to the exemplary embodiment of the present invention.

To describe the branch metric calculator 310, it will be assumed that the Viterbi decoding unit 300 according to the exemplary embodiment of the present invention has a Radix-2 configuration and uses 4 bit soft-decision binary data. The Radix-2 Viterbi decoder generates four branch metrics.

As shown in FIG. 13, the branch metric calculator 310 according to the exemplary embodiment of the present invention includes a distance calculator 311, a branch metric adder 312, and a branch metric storage unit 313.

The distance calculator 311 calculates a distance value between an input value of the Viterbi decoding unit 300 and representative values of 0 and 1. The representative values of 0 and 1 are respectively 7 and −8 in the exemplary embodiment of the present invention.

The branch metric adder 312 generates the branch metrics generated in a state transition process by using the distance value calculated by the distance calculator 311. Since the Viterbi decoding unit 300 according to the exemplary embodiment of the present invention has the Radix-2 configuration, the branch metric adder 312 generates four branch metrics BM_00, BM_01, BM_10, and BM_11. The respective branch metrics may be presented as 5 bits since they are obtained by adding two 4-bit distance values calculated by the distance calculator 311.

The branch metric storage unit 313 stores the four branch metrics generated by the branch metric adder 312. Then, the branch metrics stored in the branch metric storage unit 313 are used to calculate the path metric.

The ACS operator 320 will now be described with reference to FIG. 14 and FIG. 15.

Firstly, the norm generator 340 will be described with reference to FIG. 14.

Figure 14:
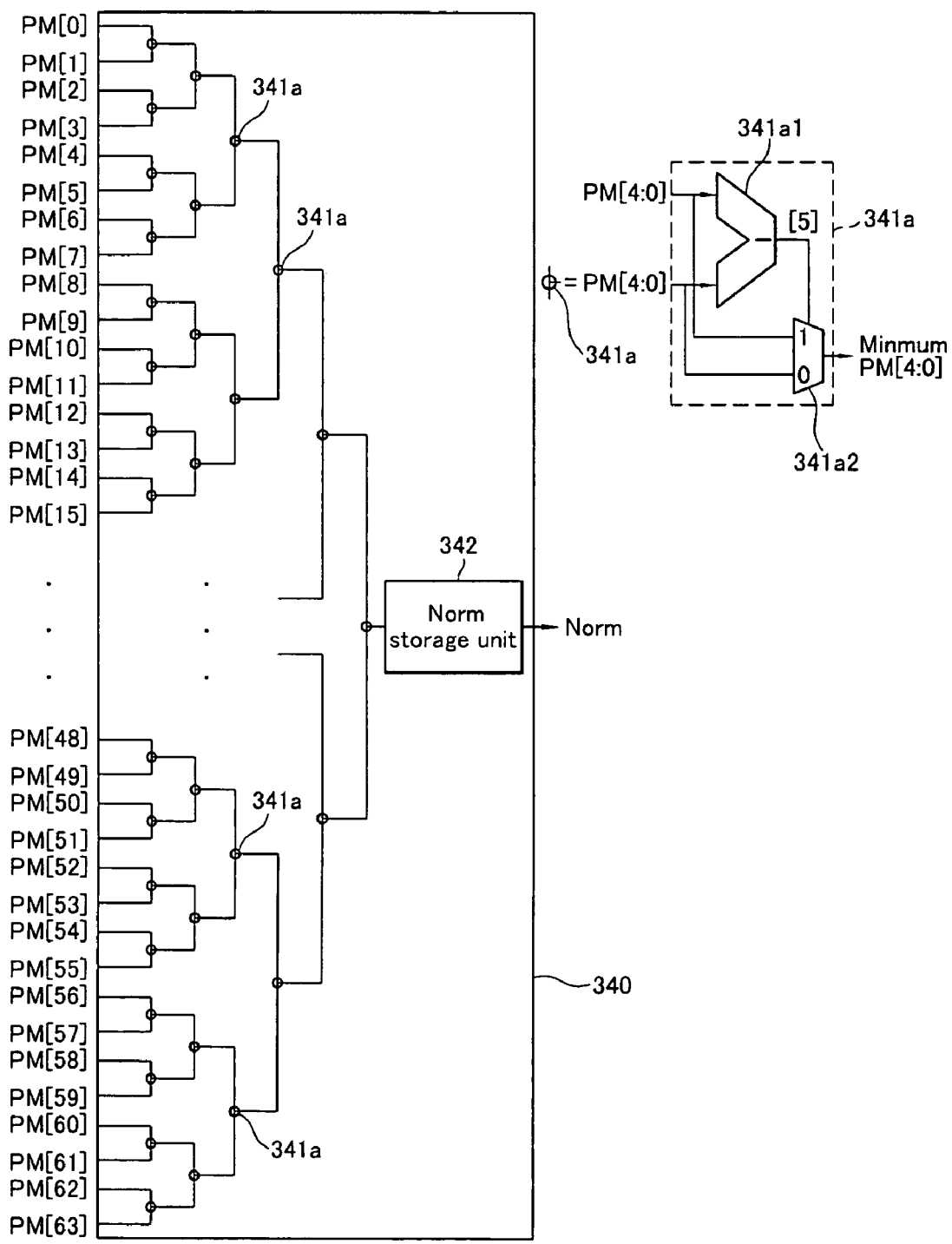
FIG. 14 shows a block diagram representing the norm generator 340 according to the exemplary embodiment of the present invention.

FIG. 14 shows a block diagram representing the norm generator 340 according to the exemplary embodiment of the present invention.

As shown in FIG. 14, the norm generator 340 includes a minimum path metric extractor 341 and a norm storage unit 342.

The minimum path metric extractor 341 extracts the normalizing factor which is a minimum path metric among the previous path metrics. In addition, the norm storage unit 342 stores the extracted norm.

The minimum path metric extractor 341 according to the exemplary embodiment of the present invention extracts the minimum value among the previous path metrics by using a plurality of path metric compare select units 341a, and the path metric compare select units 341a respectively include a comparator 341a1 and a selector 341a2.

The comparator 341a1 receives the two previous state path metrics, performs subtraction of the two values, and outputs a most significant bit (MSB) among a result value of the subtraction. When PM0 and PM1 denote the two previous state path metrics and R0(=PM0-PM1) denotes the result value of the comparator 329a1, PM0>PM1 when the MSB of R0 is 0, and PM0<PM1 when the MSB of R0 is 1. The selector 341a2 is realized by a 5-bit 2-input multiplexer, and it selects an output value by using 1-bit information generated by the comparator 329a1. The path metric compare select unit 341a according to the exemplary embodiment of the present invention selects a smaller value between PM0 and PM1, and outputs the minimum value.

The minimum path metric extractor 341 groups the previous state path metrics in pairs, and compares the respective pairs to find smaller values of the pairs. Then, the minimum path metric extractor 341 groups the found smaller values in pairs, and compares the respective pairs to find smaller values of the pairs. Accordingly, the minimum path metric extractor 341 finds the normalizing factor which is the minimum path metric. The found normalizing factor is stored in the norm storage unit 342.

The ACS operator 320 according to the exemplary embodiment of the present invention will now be described with reference to FIG. 15.

Figure 15:
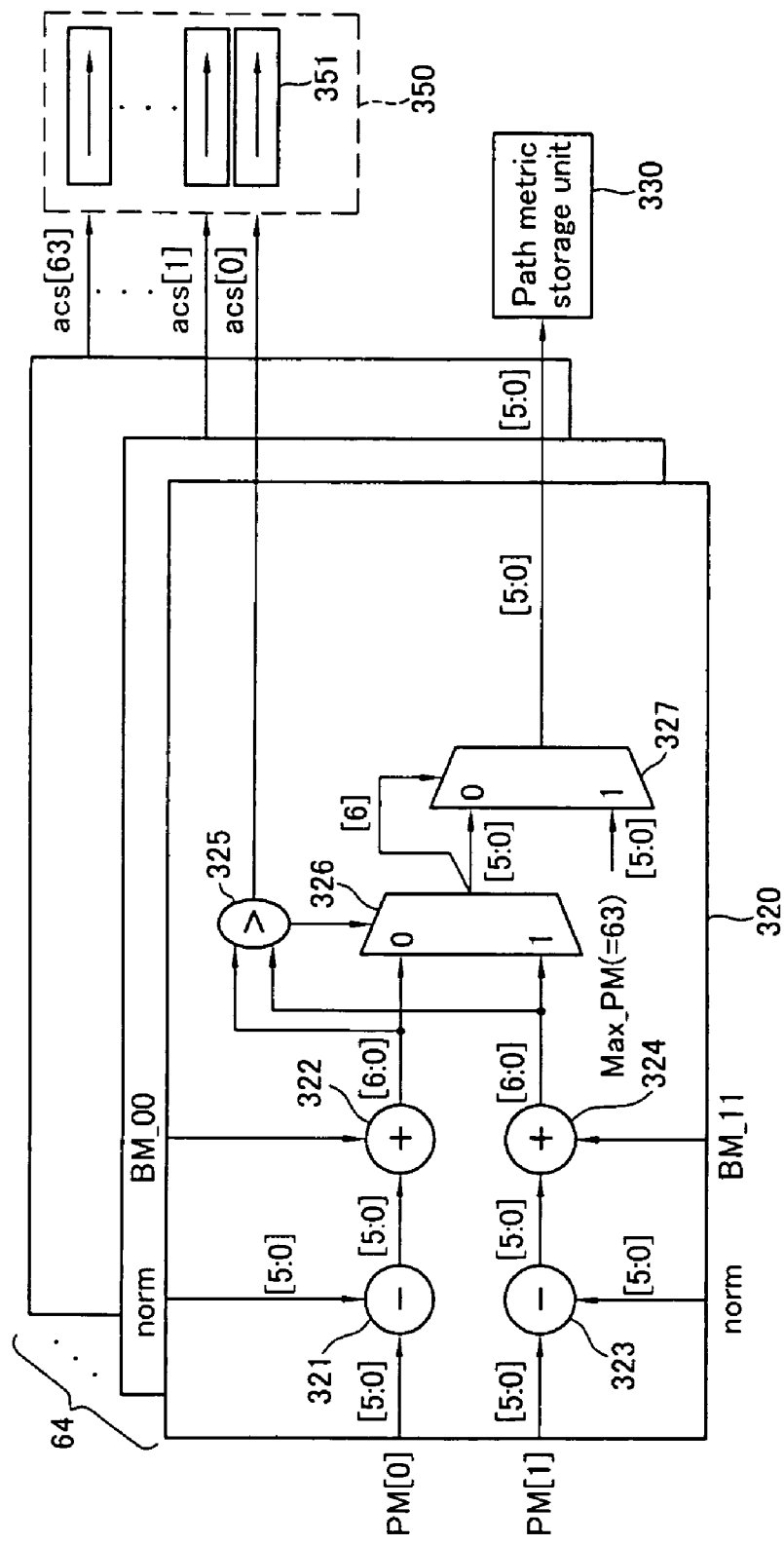
FIG. 15 shows a block diagram representing the ACS operator 320 according to the exemplary embodiment of the present invention.

FIG. 15 shows a block diagram representing the ACS operator 320 according to the exemplary embodiment of the present invention.

Since the transmitter according to the exemplary embodiment of the present invention uses the convolutional encoder having the constraint length K of 7, the convolutional encoder has 64 states. Therefore, the ACS operator 320 generates 64 path metrics and survival paths by 64 operation blocks (the 64 operation blocks are shown without reference numerals).

As shown in FIG. 15, the respective blocks of the ACS operator 320 include two normalizing units 321 and 323, two path metric adders 322 and 324, a path metric comparator 325, a path metric selector 326, and a path metric clipping unit 327.

The operation blocks of the ACS operator 320 receive two path metrics (e.g., PM[0] and PM[1] in FIG. 15) of the previous states (e.g., 0 and 1 states in FIG. 15), the path metrics for reaching a current state (e.g., a 0 state in FIG. 15), and finally selects the minimum path metric among the path metrics for reaching the current state. In addition, the respective blocks of the ACS operator 320 generate a survival path (e.g., acs[0] in FIG. 15) having the minimum path metric.

The two normalizing units 321 and 323 subtract the normalizing factor (norm) generated by the norm generator 340 from the two path metrics PM[0] and PM[1]. Accordingly, the path metric may be maintained at a predetermined number of bits (6 bits in the exemplary embodiment of the present invention) as the trellis of the transmitter convolutional encoder proceeds.

The two path metric adders 322 and 324 add branch metrics (e.g., BM_00 and BM_11) of branches (i.e., the branches reaching the current state from the previous state) to the previous state path metrics PM[0] and PM[1], and generate the metrics of paths from the respective branches to the current state.

The path metric comparator 325 receives the path metrics generated by the path metric adders 322 and 324, performs subtraction of the path metrics, and outputs a 1-bit most significant bit (MSB) thereof. The 1-bit outputted by the path metric comparator 325 is information indicating the result of comparison between the two metrics of paths from the respective branches to the current state, and indicating the survival path. The 1-bit outputted by the path metric comparator 325 is stored in an exchange register 351 corresponding to a current state of the exchange register block 350.

The path metric selector 325 receives the 1-bit outputted by the path metric comparator 325, selects a smaller value among the metrics of paths from the respective branches to the current state, and outputs the selected value.

To maintain the selected value to be in 6 bits, the path metric clipper 327 clips the selected value to be $111111_2$ when the inputted value is equal to or greater than $1000000_2$, and outputs the clipped value. Accordingly, the updated value may be maintained as 6 bits.

The path metric selected by the path metric selector 325 and clipped and outputted by the path metric clipper 327, is stored in the path metric storage unit 330 to be used for generating a subsequent state path metric.

The Viterbi decoding method according to the exemplary embodiment of the present invention will be described with reference to FIG. 16.

Figure 16:
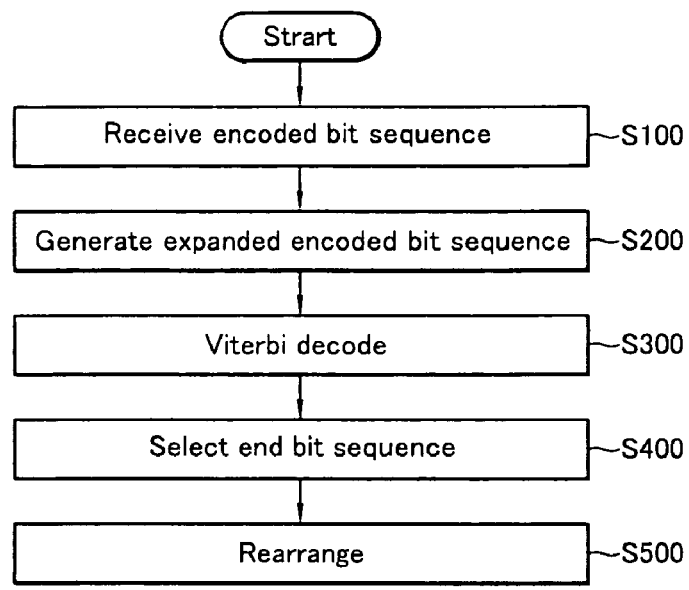
FIG. 16 shows a flowchart for representing the Viterbi decoding method according to the exemplary embodiment of the present invention.

FIG. 16 shows a flowchart for representing the Viterbi decoding method according to the exemplary embodiment of the present invention.

The receiving buffer unit 100 receives the encoded bit sequence in the convolutional encoding method from a channel in step S100.

The received bit sequence expansion unit 200 generates the expanded encoded bit sequence generated by cyclically adding a part of or the entire encoded bit sequence to the encoded bit sequence received as the unit of encoded bits from the receiving buffer unit 100 more than once.

The Viterbi decoding unit 300 receives the expanded encoded bit sequence, performs the Viterbi decoding operation in the register exchange method, and outputs the decoded data in step S300. In this case, the Viterbi decoding unit 300 calculates the branch metrics for the respective branches by using the difference between the expanded encoded bit sequence and the encoded bits on a trellis of the transmitter convolutional encoder, adds the calculated branch metric and the previous path metric to calculate the path metric reaching the current state from the respective branches, and stores the result of the compared path metrics reaching the current state from the respective branches in the exchange register 351 corresponding to the current state. In addition, the Viterbi decoding unit 300 extracts an optimal state corresponding to the minimum path metric among the path metrics, and outputs a value that is stored in the exchange register corresponding to the optimal state, as the decoded data.

In addition, the end bit sequence selector 400 selects the end bit sequence corresponding to the number of the unit of encoded bits, from the decoded data, and outputs the selected end bit sequence in step S400.

Then, the rearranging unit 500 rearranges an order of the end bit sequence to generate the final decoded data in step S500. The final decoded data are stored in the output buffer unit 600.

The above described methods and apparatuses are not only realized by the exemplary embodiment of the present invention, but, on the contrary, are intended to be realized by a program for realizing functions corresponding to the configuration of the exemplary embodiment of the present invention or a recording medium for recording the program.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The Viterbi decoder according to the exemplary embodiment of the present invention may decode the encoded bit sequence in the zero-tail convolutional encoding method and the encoded bit sequence in the tail-biting convolutional encoding method.

In addition, according to the exemplary embodiment of the present invention, the simplified Viterbi decoder may be realized.

In addition, the size of the register for the Viterbi decoder may be reduced since the size of the exchange register is smaller than the unit of encoded bits. Accordingly, an integrated circuit may be easily realized, and the power consumption caused by exchanging the register values may be greatly reduced.

More specifically, the BER performance of the Viterbi decoder according to the exemplary embodiment of the present invention may be increased to over 0.5 dB compared to that of the conventional modified register exchange method.

What is claimed is:

1. A Viterbi decoder comprising:
 a receiving buffer unit for receiving an encoded bit sequence of a convolutional encoding method from a channel;
 a received bit sequence expansion unit for receiving an encoded bit sequence corresponding to a unit of encoded bits from the receiving buffer unit, and generating an expanded encoded bit sequence by cyclically adding a part of the encoded bit sequence or the entire encoded bit sequence to the encoded bit sequence more than once;
 a Viterbi decoding unit for receiving the expanded encoded bit sequence, performing a Viterbi decoding operation in a register exchange method, and outputting decoded data;
 an end bit sequence selector for selecting an end bit sequence corresponding to the number of the unit of encoded bits among the decoded data, and outputting the end bit sequence; and
 a rearranging unit for rearranging an order of the end bit sequence to generate final decoded data.

2. The Viterbi decoder of claim 1, wherein the Viterbi decoding unit comprises:
 a branch metric calculator for calculating branch metrics on respective branches by differences between the expanded encoded bit sequence received from the received bit sequence expansion unit and encoded bits on a trellis of a transmitter convolutional encoder;
 a path metric storage unit for storing a path metric for a path selected on the trellis;

an exchange register block comprising exchange registers corresponding to the number of states of the transmitter convolutional encoder;

an add compare select (ACS) operator for adding a previous path metric to a branch metric calculated by the branch metric calculator to calculate path metrics for reaching a current state from the respective branches, storing a result of compared path metrics for reaching the current state from the respective branches in the exchange register corresponding to a current state of the exchange register block, and storing a path metric of a path selected according to the comparison result in the path metric storage unit;

an optimal state determining unit for extracting an optimal state which is a state corresponding to a minimum path metric among the path metrics stored in the path metric storage unit; and an output register selecting unit for outputting a value stored in the exchange register corresponding to the optimal state, among the exchange registers in the exchange register block, to the end bit sequence selector.

3. The Viterbi decoder of claim 2, wherein the exchange register comprises unit registers corresponding to the number that is less than the number of the unit of encoded bits, and the output register selecting unit outputs a value stored in the exchange register corresponding to the optimal state when decoding operations corresponding to the number of unit registers in the exchange register are finished.

4. The Viterbi decoder of claim 2, wherein the Viterbi decoding unit further comprises a norm generator for generating a normalizing factor for preventing the path metric from being overflowed, the path metric being accumulated as the trellis proceeds, and the ACS operator normalizes the previous path metric by using the normalizing factor.

5. The Viterbi decoder of claim 4, wherein the norm generator generates the normalizing factor by using a minimum path metric among the previous path metrics, and the ACS operator subtracts the normalizing factor from the previous path metric.

6. The Viterbi decoder of claim 2, wherein the ACS operator changes the path metric to a maximum value stored in a memory space when the path metric for reaching the current state from the respective branches is greater than the memory space of the path metric storage unit.

7. The Viterbi decoder of claim 2, wherein the branch metric calculator comprises:
a distance calculator for calculating a distance value between the encoded bit sequence received from the received bit sequence expansion unit and representative values of 0 and 1; and
a branch metric adder for generating the branch metrics generated in a state transition by using the distance value calculated by the distance calculator.

8. The Viterbi decoder of claim 7, wherein the branch metric calculator further comprises a branch metric storage unit for storing the branch metric generated by the branch metric adder.

9. A Viterbi decoding method comprising:
a) receiving an encoded bit sequence of a convolutional encoding method from a channel;
b) receiving the encoded bit sequence as a unit of encoded bits, and cyclically adding a part of the encoded bit sequence or the entire encoded bit sequence to the encoded bit sequence more than once to generate an expanded encoded bit sequence;
c) receiving the expanded encoded bit sequence, performing a Viterbi decoding operation in a register exchange method, and outputting decoded data;
d) selecting an end bit sequence corresponding to the number of the encoded unit from the decoded data, and outputting the selected end bit sequence; and
e) rearranging an order of the end bit sequence to generate final decoded data.

10. The Viterbi decoding method of claim 9, wherein c) comprises:
calculating branch metrics on respective branches by differences between the expanded encoded bit sequence and encoded bits on a trellis of a transmitter convolutional encoder;
adding the branch metric to a previous path metric to calculate a path metric for reaching a current state from the respective branches, and storing a result of compared path metrics for reaching the current state from the respective branches in an exchange register;
extracting an optimal state corresponding to a minimum path metric among the path metrics; and
outputting a value stored in the exchange register corresponding to the optimal state.

11. The Viterbi decoding method of claim 10, wherein the exchange register comprises unit registers corresponding to the number that is less than the number of the encoded unit, and wherein the outputting of the value stored in the exchange register is to output a value stored in the exchange register corresponding to the optimal state when decoding operations corresponding to the number of unit registers in the exchange register are finished.

12. The Viterbi decoding method of claim 10, wherein c) further comprises:
generating a normalizing factor for preventing the path metric from being overflowed, the path metric being accumulated as the trellis proceeds; and
normalizing the previous path metric by using the normalizing factor.

13. The Viterbi decoding method of claim 12, wherein the normalizing factor is a minimum path metric among the previous path metrics, and
the normalizing of the previous path metric is to subtract the normalizing factor from the previous path metric.

14. The Viterbi decoding method of claim 10, wherein c) further comprises changing the path metric to a maximum value stored in a memory space when the path metric for reaching the current state from the respective branches is greater than the memory space storing the path metric.

15. The Viterbi decoding method of claim 10, wherein the calculating of the branch metric comprises:
calculating a distance value between the encoded bit sequence and representative values of 0 and 1; and
generating the branch metrics generated in a state transition by using the distance value calculated.

* * * * *